(12) United States Patent
Anton

(10) Patent No.: US 6,586,114 B1
(45) Date of Patent: Jul. 1, 2003

(54) COATED ARTICLE HAVING A DARK COPPER COLOR

(75) Inventor: Bryce Randolph Anton, Longmont, CO (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

(21) Appl. No.: 10/201,813

(22) Filed: Jul. 24, 2002

(51) Int. Cl.[7] .............................................. B32B 15/04
(52) U.S. Cl. .................. 428/627; 428/632; 428/660; 428/661; 428/662; 428/663; 428/666; 428/667; 428/687; 428/472; 428/689; 428/697; 428/698; 428/699; 428/702; 428/908.8; 428/938
(58) Field of Search ................. 428/660, 627, 428/632, 661, 662, 663, 666, 667, 687, 472, 689, 697, 698, 699, 702, 908.8, 938

(56) References Cited

U.S. PATENT DOCUMENTS

| | | | | |
|---|---|---|---|---|
| 4,162,954 A | * | 7/1979 | Morrison, Jr. | 204/298.19 |
| 4,591,418 A | * | 5/1986 | Snyder | 204/192.16 |
| 4,803,127 A | * | 2/1989 | Hakim | 428/457 |
| 5,064,686 A | * | 11/1991 | McGeary | 427/124 |
| 5,254,499 A | * | 10/1993 | Sandhu et al. | 438/681 |
| 5,478,660 A | * | 12/1995 | Moysan et al. | 428/627 |
| 5,571,572 A | * | 11/1996 | Sandhu | 427/585 |
| 5,667,904 A | * | 9/1997 | Moysan et al. | 428/627 |
| 5,782,980 A | * | 7/1998 | Allen et al. | 118/715 |
| 5,824,365 A | * | 10/1998 | Sandhu et al. | 427/239 |
| 6,391,457 B1 | * | 5/2002 | Welty et al. | 428/412 |
| 6,399,219 B1 | * | 6/2002 | Welty et al. | 428/626 |
| 2002/0041974 A1 | * | 4/2002 | Welty et al. | 428/627 |

* cited by examiner

Primary Examiner—Robert R. Koehler
(74) Attorney, Agent, or Firm—Lloyd D. Doigan

(57) ABSTRACT

An article, particularly a metallic article, is coated with a multi-layer coating having the color or appearance of dark copper. The coating comprises a chromium, refractory metal or refractory metal alloy adhesion promoting layer, a titanium-zirconium alloy nitride or titanium-zirconium alloy carbonitride protective and color layer, and a titanium-zirconium alloy oxide or titanium-zirconium oxynitride color enhancing layer.

12 Claims, 1 Drawing Sheet

COATED ARTICLE HAVING A DARK COPPER COLOR

FIELD OF THE INVENTION

This invention relates to protective and decorative coatings for articles, particularly titanium or titanium alloy articles.

BACKGROUND OF THE INVENTION

It is currently the practice with various brass articles such as lamps, trivets, candlesticks, door knobs, door handles, door escutcheons and the like to fist buff and polish the surface of the article to a high gloss and to then apply a protective organic coating, such as one comprised of acrylics, urethanes, epoxies, and the like, onto this polished surface. While this system is generally satisfactory it has the drawback that the buffing and polishing operation, particularly if the article is of a complex shape, is labor intensive. Also, the known organic coatings are not always as durable as desired, particularly in outdoor applications where the coated articles are exposed to the elements and ultraviolet radiation.

This disadvantage has been remedied by applying a physical vapor deposited coating including a refractory metal nitrogen containing compound wear resistant layer. U.S. Pat. Nos. 5,667,904; 5,478,660, inter alia, describe such a coating. This coating has a brass color and includes at least one nickel basecoat deposited directly on the surface of the coated article. The nickel basecoat is deposited by plating. U.S. Pat. Nos. 6,399,219 and 6,391,457 describe vapor deposited coatings containing a polymeric basecoat.

It would be very advantageous if a coating could be provided which had a dark copper color and did not require the nickel or polymeric basecoat, as this would eliminate a cumbersome and expensive plating or polymeric deposition operation. The present invention attains these objectives, particularly with a titanium or titanium alloy substrate.

SUMMARY OF THE INVENTION

The present invention is directed to an article or substrate, particularly a metallic article such as stainless steel or titanium, having a multi-layer coating on at least a portion of its surface. The article has deposited on its surface a coating comprised of strike layer of chromium, refractory metal or refractory metal alloy such as titanium-zirconium alloy, over the strike layer is a color layer comprised of titanium-zirconium alloy nitride or carbonitride, over the color layer is deposited a zirconium-titanium alloy oxide or zirconium-titanium alloy oxynitride. The coating is decorative and also provides corrosion resistance and wear resistance. The coating provides the appearance or color of dark copper, i.e., has a dark copper color tone. Thus, an article surface having the coating thereon has a dark copper color with a highly polished or textured surface.

The first layer deposited directly on the article or substrate is an adhesion promoting or strike layer comprised of a metal, preferably chromium, refractory metal or refractory metal alloy. Over the strike layer is an opaque color layer comprised of a titanium-zirconium alloy nitride or carbonitride. This color layer is important to the color of the final product. The top layer is a semi-transparent layer comprised of a titanium-zirconium oxide or titanium-zirconium oxynitride.

The strike layer and color layer are preferably applied by a vapor deposition such as physical vapor deposition or chemical vapor deposition.

DESCRIPTION OF THE PREFERRED EMBODIMENT

Figure 1:
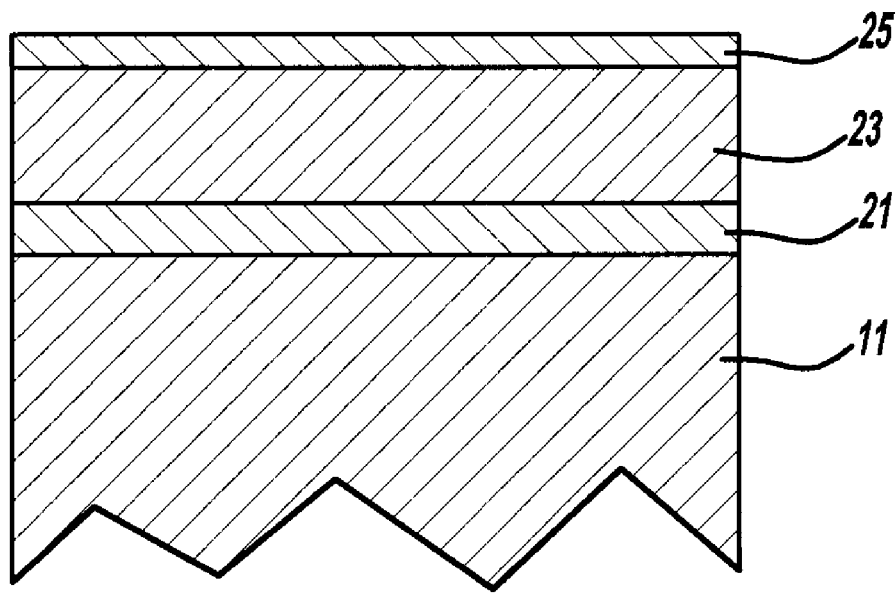
FIG. 1 is a cross-sectional view, not to scale, of a portion of an article having the multi-layer coating of the instant invention on its surface.

The article or substrate 11 can be comprised of any material such as plastic, ceramic, metal or metallic alloy. In one embodiment the substrate is a metal or metal alloy such as a titanium alloy. One particularly useful titanium alloy is an alloy of titanium, aluminum and vanadium which is commercially available as "Ti 6-4".

On the surface of the article 11 is deposited, by vapor deposition such as physical vapor deposition, a thin strike or adhesion promoting layer 21. The adhesion promoting layer is comprised of a metal, preferably chromium, refractory metal or refractory metal alloy. The refractory metals include titanium, zirconium, hafnium, tantalum, and the like. The refractory metal alloys include titanium-zirconium alloy, titanium-hafnium alloy, zirconium-hafnium alloy, and the like. In a preferred embodiment the strike layer 21 is comprised of a titanium-zirconium alloy. The titanium-zirconium alloy is generally comprised of from about 25 to about 75 weight percent zirconium and from about 75 to about 25 weight percent titanium, preferably about 50 weight percent zirconium and about 50 weight percent titanium. Layer 21 has a thickness which is at least effective to promote or improve the adhesion of layer 23 to the substrate surface 11. This thickness is generally from about 60 nm to about 120 nm, preferably from about 80 nm to about 100 nm.

Vapor deposition processes are conventional and well known in the art. They include physical vapor deposition and chemical vapor deposition.

Physical vapor deposition processes are well known and conventional and include cathodic arc evaporation (CAE) or sputtering, and the like. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Chemical vapor deposition (CVD) is a well known and conventional process. CVD is generally classified into one of three types. The first two are principally predicated upon reactor pressure, and are designated as atmospheric pressure chemical vapor deposition (APCVD) or low pressure chemical vapor deposition (LPCVD). The first category is referred to as plasma enhanced chemical vapor deposition. CVD processes are disclosed, inter alia, in U.S. Pat. Nos. 5,782,980; 5,824,365; 5,254,499; 4,803,127; 5,064,686 and 5,571,572, all of which are incorporated herein by reference.

Over the titanium-zirconium alloy adhesion promoting layer 21 is disposed color layer 23. Color layer 23 is comprised of titanium-zirconium alloy nitride or titanium-zirconium alloy carbonitride.

Layer 23 provides wear and abrasion resistance and the desired copper color, specifically a dark copper color. Layer 23 is deposited on layer 21 by any of the well known and conventional vapor deposition techniques, for example physical vapor deposition techniques such as reactive sputtering and reactive cathodic arc evaporation.

Reactive cathodic arc evaporation and reactive sputtering are generally similar to ordinary sputtering and cathodic arc evaporation except that a reactive gas is introduced into the chamber which reacts with the dislodged target material. Thus, in the case where titanium-zirconium nitride is the layer 23, the cathode is comprised of titanium-zirconium alloy and nitrogen is that reactive gas introduce into the chamber.

Layer 23 has a thickness at least effective to provide wear and abrasion resistance and the dark copper color. Generally, this thickness is at least about 100 nm, preferably about 200 nm. The upper thickness range is not critical and is governed by secondary considerations such as costs and the like. Generally, layer 23 should not be thicker than about 1 micron, preferably about 750 nm.

Over the protective and color layer 23 is deposited by vapor deposition a titanium-zirconium alloy oxide or titanium-zirconium alloy oxynitride 25. The titanium-zirconium alloy oxides and their preparation are conventional and well known in the art. The titanium-zirconium alloy oxynitrides are also conventional and well known in the art. They are comprised of the reaction products of titanium-zirconium alloy, oxygen and nitrogen. The reaction products of titanium-zirconium alloy, oxygen and nitrogen are generally comprised of titanium-zirconium alloy oxide and titanium-zirconium nitride. Layer 25 functions to improve or enhance the chemical resistance of the coating and to enhance the dark copper color of the color layer 23.

Oxide layer 25 can be deposited by well known and conventional vapor deposition techniques, including reactive sputtering and reactive cathodic arc evaporation. In this case the reactive gas may be oxygen. These oxides and their preparation are conventional and well known.

Thin oxide layer 25 has a thickness at least effective to provide improved or enhanced chemical resistance and to enhance the dark copper color. It should not be so thick as to obscure or hide the dark copper color of the color layer 23. Generally, this thickness is at least about 5 nm, preferably at least about 10 nm. The thickness should generally not be greater than about 50 nm, preferably not greater than about 40 nm.

In order that the invention may be more readily understood the following example is provided. The example is illustrative and does not limit the invention thereto.

EXAMPLE 1

A cylindrical cathode is mounted in the center of the deposition vacuum chamber and connected to negative outputs of a variable D.C. power supply. The positive side of the power supply is connected to the chamber wall (anode). The cathode material is a titanium-zirconium alloy (50:50 wt %).

Clean, polished stainless steel substrates are mounted on spindles on a ring that rotates around the outside of the cylindrical cathode with two-axis or planetary motion to provide uniform deposition on all sides of the substrate. The spindles are electrically isolated from the chamber and provided with rotatable contacts so that a bias voltage may be applied to the substrates. A pulsed high voltage DC power supply is connected to provide bias to the substrates and is set at a pulsing frequency of 20 kHz and a duty cycle of 50%.

The vacuum chamber is evacuated to a base pressure of $2.0 \times 10^{-5}$ Torr.

The substrates are then subjected to an argon ion etch (glow discharge) in which a negative bias of 400V is applied in a 25.0 mTorr argon atmosphere. This glow discharge cleaning step lasts for 10 minutes. The next surface preparation step is a high-bias arc plasma etch in which a negative bias of 500V is applied to the substrates while an arc of 230 amperes is struck and sustained on the cathode. The duration of the high bias cleaning step is 5 minutes. This arc current is maintained throughout the deposition process.

Argon gas is introduced at a rate sufficient to maintain a pressure of about 5.0 mTorr. The substrate bias is reduced to 70V. A layer of titanium-zirconium having an average thickness of 100 nm is deposited in approximately 6 minutes.

The second layer is formed by introducing a 1:4 mixture of $AR:N_2$ to a total pressure of 15.0 mTorr. This forms a 300 nm titanium-zirconium nitride layer in approximately 25 minutes. This layer provides the base color for the finish.

The final semi-transparent oxide layer is formed by introducing a 1:2 mixture of $Ar:O_2$ at a pressure of 2.0 mTorr for approximately 1 to 2 minutes to make a 20 nm thick layer. This layer aids in darkening the color and bringing the right levels of red and yellow to the finished product. The arc is extinguished at the end of this last deposition period, the vacuum chamber is vented and the coated substrates are removed. The "L" value of the color layer 23 should be about 62 (range of 60 to 64), the "a" value should be approximately 12.5 (range of 11 to 14), and the "b" value should be about 18 (range of 16–20).[1]

[1] Color measurements were made using a Minolta spectrophotometer using D illumination, 10 degree observer angle with the CIELAB color coordinate system.

Layer 25 should preferably be semi-transparent. Layer 25 will result in an "L" value of about 53 (50 to 56 range), an "a" value of about 18 (range of 16 to 20), and a "b" value of about 23 (range of 20 to 25).

While certain embodiments of the invention have been described for purposes of illustration, it is to be understood that there may be other various embodiments and modifications which fall within the general scope of the invention.

What is claimed is:

1. An article having on at least a portion of its surface a multi-layer dark copper colored protective coating comprising;

an adhesion promoting layer selected from the group consisting of chromium, refractory metal or refractory metal alloy;

color layer selected from the group consisting of titanium-zirconium alloy nitride and titanium-zirconium alloy carbonitride;

color enhancing layer comprised of zirconium-titanium alloy oxide or reaction products of zirconium-titanium alloy, oxygen and nitrogen.

2. The article of claim 1 wherein said adhesion promoting layer is comprised of titanium-zirconium alloy.

3. The article of claim 1 wherein said color enhancing layer is comprised of zirconium-titanium alloy oxide.

4. The article of claim 1 wherein said color enhancing layer is comprised of the reaction products of zirconium-titanium alloy, oxygen and nitrogen.

5. The article of claim 1 wherein said color layer is comprised of titanium-zirconium nitride.

6. The article of claim 1 wherein said color layer is comprised of titanium-zirconium carbonitride.

7. The article of claim 1 wherein said titanium-zirconium alloy is comprised of from about 25 to about 75 weight percent titanium and from about 75 to about 25 weight percent zirconium.

8. The article of claim 7 wherein said titanium-zirconium alloy is comprised of about 50 weight percent titanium and about 50 weight percent zirconium.

9. The article of claim 1 wherein said substrate is a metallic substrate.

10. The article of claim 9 wherein said substrate is a metal alloy.

11. The article of claim 10 wherein said substrate is titanium-aluminum vanadium alloy.

12. The article of claim 1 wherein the dark copper color has "L" value of from about 60 to about 64, "a" value of from about 11 to about 14, and "b" value of from about 20 to about 25.

* * * * *